(12) United States Patent
Al-Shamma

(10) Patent No.: US 6,442,093 B1
(45) Date of Patent: Aug. 27, 2002

(54) CASCODE BARREL READ

(75) Inventor: Ali K. Al-Shamma, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/696,054

(22) Filed: Oct. 25, 2000

Related U.S. Application Data

(60) Provisional application No. 60/210,120, filed on Jun. 7, 2000.

(51) Int. Cl.[7] ................................................. G11C 7/00
(52) U.S. Cl. ................. 365/221; 365/189.02; 365/238.5
(58) Field of Search .................. 365/189.01, 189.02, 365/205–208, 221, 238.5

(56) References Cited

U.S. PATENT DOCUMENTS

| | | | | |
|---|---|---|---|---|
| 5,572,477 A | * | 11/1996 | Jung | 365/221 |
| 5,748,561 A | * | 5/1998 | Hotta | 365/238.5 |
| 6,002,616 A | * | 12/1999 | Jeong | 365/189.09 |
| 6,067,274 A | * | 5/2000 | Yoshimoto | 365/238.5 |

\* cited by examiner

*Primary Examiner*—Son Mai

(57) ABSTRACT

A core memory containing an array of core cell memory elements are accessed using a cascode barrel reading arrangement and method. The cascode barrel read uses a plurality of cascodes and a plurality of sense amplifiers to read core cells that have consecutive array addresses. The core cells are connected with the plurality of cascodes via a core cell selector. After data from a core cell from a particular cascode has been read and the next consecutive core cell is being read from a different cascode, the original cascode looks ahead to the core cell with the next highest address. Consequently, when the sense amplifier is ready to sense the original cascode again, the data from the core cell with the next highest address has already been loaded and is immediately ready to be read.

10 Claims, 3 Drawing Sheets

US 6,442,093 B1

CASCODE BARREL READ

This application claims the benefit of provisional application 60/210,120 filed Jun. 7, 2000.

FIELD OF THE INVENTION

The present invention relates to the field of memory devices. More particularly, the invention relates to a method and arrangement for cascode barrel reading of data from a core memory of a memory device.

BACKGROUND OF THE INVENTION

The overall array architecture for a typical integrated circuit containing a memory includes a core memory, herein referred to as a core, and input/output circuitry, herein referred to as the periphery. The core generally contains a plurality of core cells (i.e. individual memory elements) that are arranged in an array of rows and columns. The core cells contain at least one bit of data and are accessed through the periphery to external elements, such as a microprocessor, which require the data. The periphery includes the circuitry controlling the access of the core cells.

One arrangement by which data from the core may be accessed is by use of a plurality of cascodes and a plurality of sense amplifiers, herein referred to as samplers. In general, the cascodes determine the current or voltage from a core cell and the samplers sense the current or voltage from the cascode. When data from a core cell is requested, the cascode is accessed and outputs a result along a test bit line to the sampler. The output of the cascode is dependent on the state of the core cell. The sampler detects the difference between the test bit line containing the output of the cascode and a reference bit line containing the output of a reference cell. The sampler then compares the two bit lines and determines whether the core cell is programmed.

In general, when the core is accessed, the microprocessor or other external element requires a sizeable amount of data stored in consecutive core cells. This leads to a problem with the above arrangement. Because the delay through the cascode or time to obtain a valid output through the cascode, is large compared to the time to obtain a valid output from the sampler, the total amount of time for a set of data from consecutive core cells to be accessed is very large. Thus, especially with the huge increase in the speed of microprocessors (and other external elements), an increase in the access/readout speed of data from a set of consecutive core cells is beneficial.

BRIEF SUMMARY OF THE INVENTION

In view of the above, a method and arrangement for cascode barrel reading of data from a core memory of a memory device is provided.

A first aspect of the invention is directed to a method for cascode barrel reading of data from a core memory of a memory device. The method comprises consecutively accessing a set of consecutive core cells contained in the plurality of core cells via a plurality of cascodes. Each cascode is connected with a subset of the set of consecutive core cells. An output of a set of the plurality of cascodes is sensed via at least one sampler and each sampler is connected with at least two cascodes. The core cells contained in the set of consecutive core cells are consecutively accessed and each cascode looks ahead such that after one of the pair of core cells in one cascode is accessed and the output of the one cascode is sensed by a corresponding sampler, the other of the pair of core cells in the one cascode is accessed during a time period in which the three core cells having addresses between the pair of core cells are consecutively accessed and sensed by the corresponding sampler.

The following figures and detailed description of the preferred embodiments will more clearly demonstrate these and other objects and advantages of the invention.

DETAILED DESCRIPTION OF THE PRESENTLY PREFERRED EMBODIMENTS OF THE INVENTION

The overall architecture for a typical integrated circuit containing a memory includes a core and sets of row decoders and column decoders and/or multiplexors. The core usually contains information stored in individual memory elements called core cells that are accessed by the row (or word line) decoders, used to access specific memory rows within a particular memory block of the core, and the column decoders and/or multiplexors, used to access specific memory columns within a particular memory block of the core. Thus, any core cell within the memory array is selectable by use of the row decoders and column decoders and/or multiplexors.

The core cells may be constructed from any structure capable of retaining state (bit) information and suitable for high-speed access to elements external to the core, e.g. a microprocessor. Typical core cells may be non-volatile memory elements such as non-volatile transistors or charge-carrying devices. A single core cell may hold either a single bit (i.e. 0 or 1) or multiple bits (e.g. 0, 1, 2, 3) depending on the type of non-volatile transistors used, for example. The core may be either only readable or read/writable, that is to say that the core cells may store one set of information permanently or may be able to overwrite information contained in the core cells. Generally, when the core cell is accessed, a voltage is applied to the gate (or base) of the transistor comprising the core cell and either the current or voltage at a predetermined test point corresponding to the selected core cell is examined to determine the data contained in the core cell. Typically multiple core cells are accessed at the same time and the data is read into/out of individual bit lines.

Figure 1:
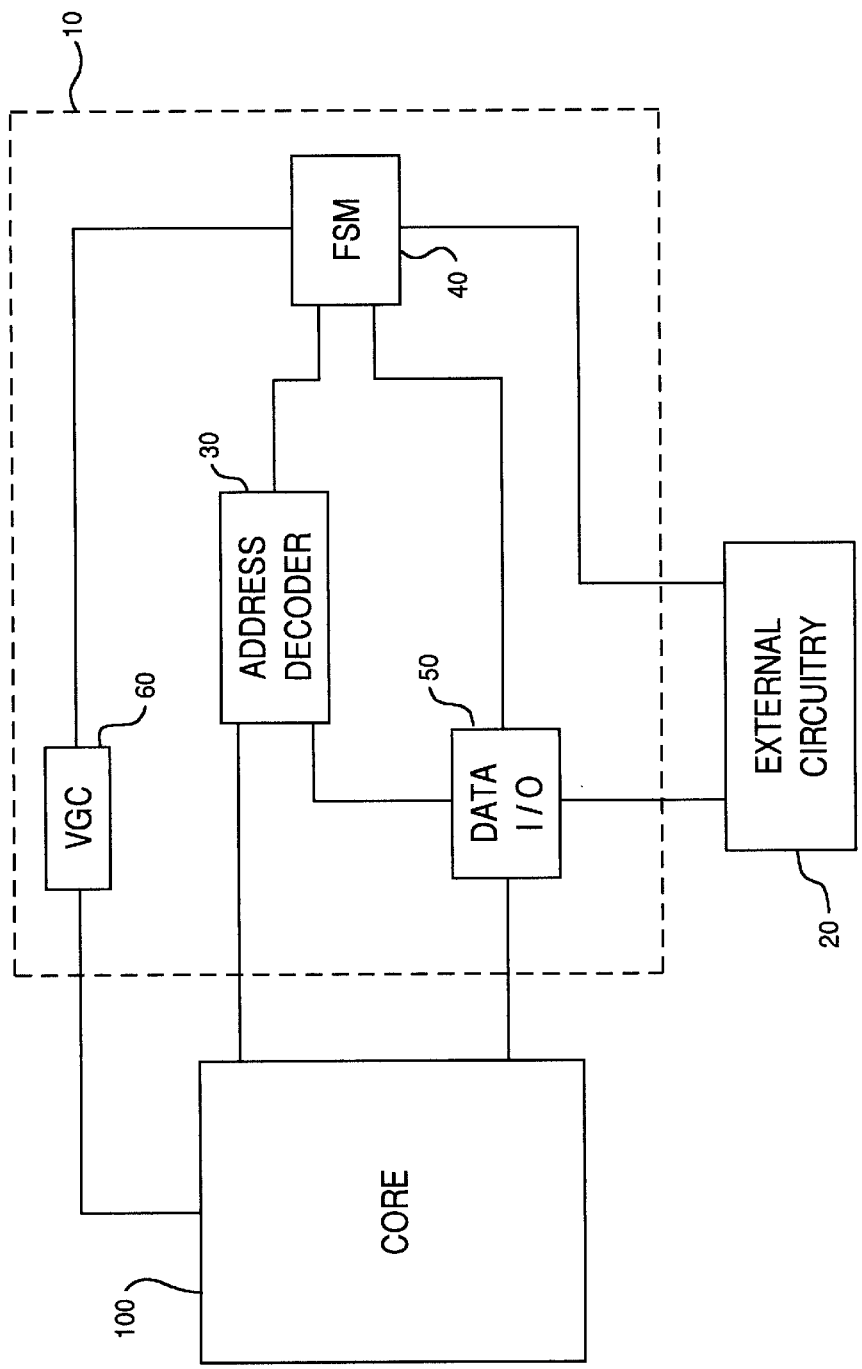
FIG. 1 shows a block diagram of the overall architecture according to a first embodiment of the invention.

FIG. 1 shows an overall block diagram of a first embodiment of the present invention. In FIG. 1, the core 100 is connected with the periphery 10, which is in turn connected with circuitry 20 external to the memory integrated circuit. In general, the periphery 10 includes an address decoder 30, a finite state machine (FSM) 40, data input/output circuitry 50, and a voltage generating circuit (VGC) 60. The FSM 40 controls overall operation of the periphery 10 and may be part of external circuitry 20. The VGC 20 generates necessary voltages for reading and writing data into and out of the core 100. The data input/output circuitry 50 provides a two-way data path between the core 100 and the external circuitry 20. The periphery 10 receives a request for data containing input addresses from the external circuitry 20, which is subsequently decoded by the address decoder 30.

The address decoder 30 includes both the bit line and word line decoders and decodes the addresses of desired core cells in the core 100. Data is communicated with the periphery 10 and the external circuitry 20 through the data in/out circuitry 50. The address signal decoded by the address decoder 30 is a multiple bit address defining one or more unique locations in the core 100 for accessing data. The address decoder 30 decodes the input address and selects at least one bit line (not shown) and at least one word line (not shown) in the core 100.

Figure 2:
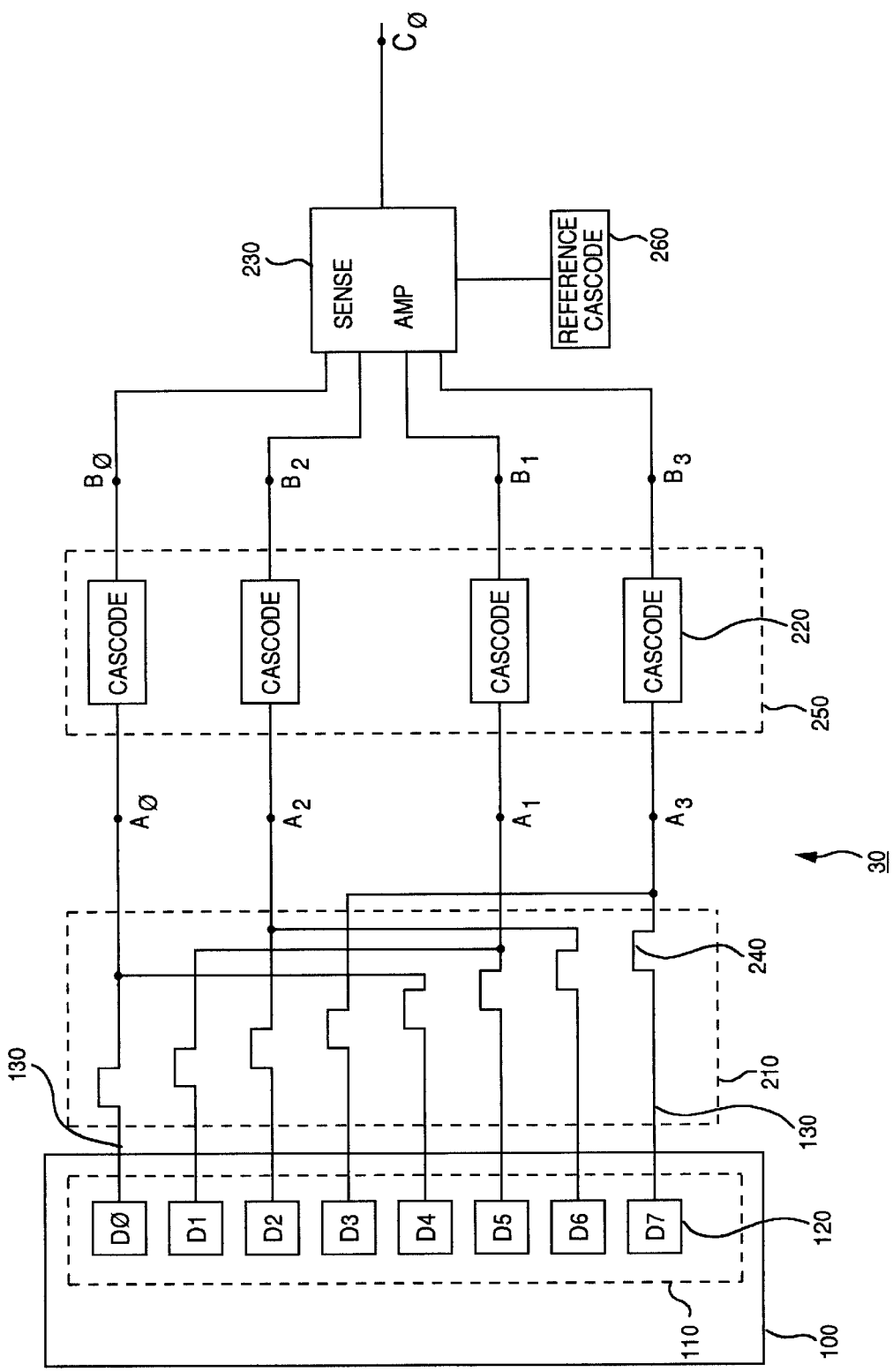
FIG. 2 illustrates a core and periphery according to a first embodiment of the invention.

An arrangement of the cascode barrel read according to the preferred embodiment, as illustrated in FIG. 2, includes a core 100 containing core cells 120. The core cells 120, in this case, are grouped in sets of consecutively addressed core cells 110 and are accessed by the internal addressing architecture 200 by bit lines 130 connected with the core cells 120. In the internal addressing architecture 200, sets of core cell selectors 210 are connected with the core cells 120 and a plurality of cascodes 220. The cascodes 220, in turn, are connected with a plurality of samplers 230, which are selectable sensing amplifiers whose outputs are eventually read by the microprocessor requiring the information.

One implementation of the cascode 220, as mentioned above, is a current detector, i.e. the cascode 220 detects whether a current is being passed through the selected core cell 120. As above, the cascode 220 does not necessarily test the selected core cell 120 itself, but may test the bit line connected with the selected core cell 120 when voltage is applied to the selected core cell 120. Alternatively, the cascode 220 may apply a voltage or charge to the bit line of the selected core cell 120 and determine if the voltage is changing, say pulled to ground. In one embodiment, if the selected core cell 120 is programmed, no current is detected by the cascode 220, but if the selected core cell 120 is erased, then the cascode 220 detects current passing through the selected core cell 120. This is to say that the voltage on the selected core cell bit line 130 is pulled down if the selected core cell 120 is erased. As the core 100 is usually large (at least 8M core cells for example), the capacitance of the core 100 is large and thus the time required to supply the charge, read the current and output the data, from a selected core cell 120 is relatively large (60 ns for example). In this manner, for instance, the data of either single bit or multi bit non-volatile core cells accessed may be determined.

The sampler 230 essentially acts as a comparator by comparing the output of the cascode 220 to a reference current or voltage, such as that supplied by a reference cascode 260. Although a reference cascode 260 is shown in FIG. 2, a reference bit line, reference cell, or other source of reference current or voltage may be used. This is to say that, while the cascode 220 determines whether current is being passed through a selected core cell 120, the sampler 230 determines whether the current is sufficient to be considered erased or programmed. In addition, the output of the sampler 230 is selected between the sampler 230 inputs to enable sensing of the desired cascode 220 output. The selection is controlled by the FSM 40 and external circuitry 20, similar to the selection in a conventional multiplexor. However, in addition to selecting the input cascodes 220 for sensing in the revolving manner described below, the sampler 230 also tests the sufficiency of the current from the core cell 120.

In the illustration of the cascode barrel read in FIG. 2, pairs of core cells in a set of consecutively addressed core cells 110 are connected with a corresponding cascode 220. A core cell selector 240 selects one core cell 120 of the pair of core cells as an input to the cascode 220. Thus, the input of the core cell selector 240 is at least one of the bit lines 130 from the pair of core cells corresponding to the particular cascode 220 and the output of the core cell selector 240 fed into the input of the corresponding cascode 220. The core cell selector 240 may be a transistor, combination of transistors, switch, or any element capable of selecting one of the pair of core cells. Further, although in FIG. 2 one core cell selector 240 has been shown for each core cell 120, the core cell selector 240 may be a multiplexor or similar element, in which outputs from multiple core cells are connected with the input of the core cell selector 240 and only one of these at a time is selected to be connected with the corresponding cascode 220. The FSM 40 and external circuitry 20 controls the selection of the core cell selector 240 output. The outputs from a set of four cascodes 250 are fed into an input of the sampler 230. The output of the sampler 230 may be transmitted through other input/output circuitry 50 along a bus 70 to the microprocessor or other external circuitry 20, requiring the data.

As illustrated in FIG. 2, in the cascode barrel read arrangement of the present invention, only four cascodes and one sampler are required to access consecutive data in a set of eight consecutive core cells. This is in contrast with the conventional arrangement or conventional burst arrangement of accessing consecutive data from the core cells, in which one sampler is dedicated for each cascode. Thus, while a conventional core reading scheme may require 16 cascodes and 16 samplers or a conventional burst mode scheme may require 32 cascodes and 32 samplers, the cascode barrel read of the present invention may use 64 cascodes and 16 samplers. This provides the benefits of a reduced number of samplers, reducing the amount and size of the integrated circuitry, while increasing the readout speed of the consecutive core cells in the core.

In addition, as shown in FIG. 2, the pair of core cells that are connected through the core cell selector 240 to the corresponding cascode 220 are arranged such that three other consecutively addressed core cells exist between the addresses of the pair of core cells in the cascode 220. These three other core cells are themselves connected with three individual cascodes and similarly paired with additional core cells from the set of consecutively addressed core cells such that the inputs to each cascode are data from core cells being separated by four addresses. Thus, the first cascode outputs data from core cells D0 and D4 to the sampler, the second cascode outputs data from core cells D1 and D5 to the sampler, the third cascode outputs data from core cells D2 and D6 to the sampler, and the fourth cascode outputs data from core cells D3 and D7 to the sampler.

A typical delay through the cascode 220 is approximately 60 ns, i.e. the time to obtain a valid data output once a core cell is selected is 60 ns. Once valid data is produced from the cascode 220 and selected by the sampler 230, valid data is produced from the sampler in approximately 20 ns(i.e. the delay of the sampler 230 is 20 ns). Therefore, the access time for a microprocessor requesting data from a single core cell 120 in the core 100 is 80 ns, including only the delay from the core cell 120 to the output of the sampler 230. Thus, to read (i.e. access) a set of eight core cells using the conventional arrangement would take 80 ns×8=640 ns, irrespective of whether the eight core cells have consecutive addresses or random addresses. An advantage of increasing access speed may be gained by using the preferred embodiment of the cascode barrel read in accessing data from consecutive core cells using the technique described below.

The preferred embodiment of the cascode barrel read uses a look ahead process in which each selected cascode looks ahead to data from the core cell connected with that particular cascode and having the next highest address after data from the first core cell has been read from the sampler and prior to the output of that selected cascode being next selected by the sampler. In other words, after the data from the core cell of an original cascode is read from the sampler and the sampler has selected the cascode whose output contains data from the next consecutive core cell, valid data from the other core cell of the original cascode is established on the output of the original cascode prior to the next selection of the original cascode by the sampler. Thus, although the delay of the cascode itself has not increased, the cascode is ready to be accessed by the sampler, i.e. valid data from the next core cell is on the output of the cascode, when the sampler next selects the cascode. This is typically called a burst mode, in which the time of access for data from consecutive core cells after the initial core cell is no longer 60 ns, but 20 ns delay of the sampler, that is the output from the set of consecutive core cells is read in 20 ns bursts. The cascode barrel read is so named because, unlike the conventional arrangement or other burst mode arrangements, the cascodes are accessed in a rotating, barrel-type system.

Figure 3:
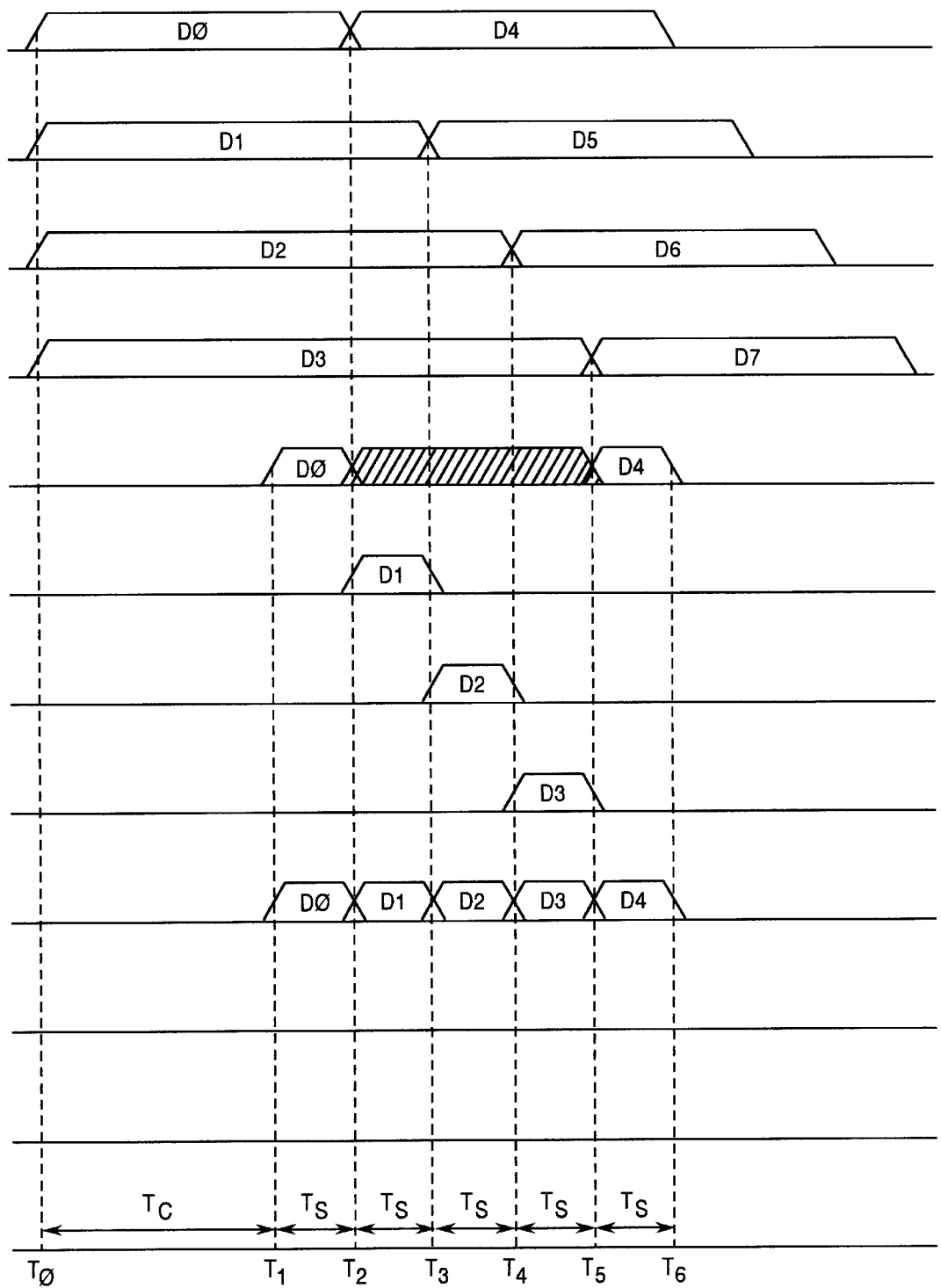
FIG. 3 depicts timing diagrams according to a first embodiment of the invention.

Timing diagrams for the operation of preferred embodiment when a microprocessor or other external element requests data from the set of consecutively addressed core cells in the core are shown in FIG. 3. Briefly, in response to the data request, the four core cell selectors respectively select the first four core cells, which are accessed by the respective cascodes at time t=0. The sampler also selects the output of the first cascode at time $t=t_0$ (0 ns), which senses valid data from the first core cell after the delay of first cascode at $t=t_1$ (60 ns). The sampler then produces data after the sampler delay at $t=t_2$ (80 ns). After data from the first core cell is produced from the sampler, the second cascode is selected by the sampler at $t=t_2$ (80 ns).

The second cascode has had the delay of both the first cascode and the sampler to produced valid data from the second consecutive core cell, and thus, the sampler can immediately start to read the data from the second cascode. At the same time, $t=t_2$ (80 ns), that the selector on the sampler selects the second cascode, the first core cell selector selects data from the fifth core cell (the other core cell connected with the first cascode).

The sampler now outputs data from the second consecutive core cell only taking the sampler delay, i.e. at $t=t_3$ (100 ns). As above, after data from the second core cell is produced from the sampler, the third cascode is selected by the sampler at $t=t_3$ (100 ns). The third cascode has had the delay of both the first and second cascodes and the sampler to produce valid data from the second consecutive core cell, and thus, the sampler can immediately start to read the data from the third cascode. At the same time, $t=t_3$ (100 ns), that the selector on the sampler selects the third cascode, the second core cell selector selects data from the sixth core cell (the other core cell connected with the second cascode).

The same thing occurs for the third and fourth cascodes. However, unlike the conventional consecutive read or burst mode read, after valid data from the fourth cascode is sensed by the sampler and the sampler switches back to the first cascode at $t=t_5$ (140 ns), the first cascode has had enough time to delay valid data from the fifth core cell. This is to say that the delay of the cascode is 60 ns, which is the time that the sampler takes to produce data from the second, third, and fourth cascodes (3×20 ns=60 ns). Thus, the sampler immediately starts sensing the valid output from the first cascode and valid data from the fifth core cell is read out 20 ns later at $t=t_6$ (160 ns). This continues until the eighth and last consecutive core cell has been accessed and data read out.

Note that the numbers used are purely for illustrative purposes. By increasing the number of cascodes, the burst speed increases, within timing limitations. For example, if the speed required to access core cells (core speed) was 40 ns and a burst speed of 5 ns is desired, then eight cascodes are used. This is to say that the core speed/burst speed =# of cascodes necessary.

For simplicity, FIG. 2 only illustrates eight core cells, four cascodes, and one sampler, however, as apparent from the above, any number of core cells, cascodes, and samplers may be present and not depart from the idea of the invention. Any number of core cells may be connected with each cascode as long as there is adequate time for the cascode to look ahead and output valid data from the next consecutive core cell connected with that cascode before the sampler reselects it (to access data from the next consecutive core cell connected with that cascode). Thus, for example, the 64M core cells contained in a 64M bit core are disposed in a 8K×8K array (8K output bit lines and 8K address word lines). In general, if one word is 16 bits in length, thus, 16 samplers and accordingly 16×4 =64 cascodes are desirable. In this case, for a core having 64 cascodes, each cascode will have 8K (bitlines)/64 (cascodes) =128 bitlines/core cells connected with each cascode.

The timing diagram of FIG. 3 shows the input to the cascodes ($A_n$), the output of the cascodes ($B_n$), and the output of the sampler ($C_0$). In the timing diagram, the core is initially accessed at t=0, at which time the core cell selector for each cascode selects the core cell having the lowest address and the sampler selects the output of the first cascode. At time $t_1$, 60 ns in this case, the first cascode outputs the valid input core cell data (D0) and the sampler reads this data. At time $t_2$, 80 ns in this case, the sampler outputs the data (D0), the core cell selector for the first cascode switches so that the first cascode accesses the core cell having the next lowest address connected with the first cascode (i.e. D4), and the sampler is selected to sense the output from the second cascode. Note that $T_c$ is the time to obtain a valid output for a cascode and $T_s$ is the time to obtain a valid output for the sampler.

As above, at time $t_3$, 100 ns in this case, the second cascode has had enough time to produce valid data (D1) from the accessed core cell and the sampler is thus able to start sensing the second cascode immediately. The sampler outputs the data, the core cell selector for the second cascode switches so that the second cascode accesses the core cell having the next lowest address connected with the second cascode (i.e. D5), and the sampler is selected to sense the output from the third cascode.

At time $t_4$, 120 ns in this case, the third cascode has had enough time to produce valid data (D2) from the accessed core cell and the sampler is thus able to start sensing the third cascode, as before, immediately. The core cell selector for the third cascode switches so that the third cascode accesses the core cell having the next lowest address connected with the second cascode (i.e. D6), and the sampler is selected to sense the output from the fourth cascode. At time $t_5$, 140 ns in this case, the fourth cascode has had enough time to produce valid data (D3) from the accessed core cell and the sampler is thus able to start sensing the fourth cascode immediately. The core cell selector for the fourth cascode switches so that the fourth cascode accesses the core cell having the next lowest address connected with the fourth cascode (i.e. D6), and the sampler is selected to sense the output from the first cascode again. In this case, $t_5-t_2=3$ $T_s=T_c=60$ ns and thus, as above, the first cascode has had enough time to produce valid data from the next lowest core cell (i.e. D4) and the sampler is able to start sensing the first cascode immediately. This cycle continues, with the sampler outputting data from the consecutive core cells in $T_s$ (20 ns) bursts, until data from all of the core cells requested is produced.

The preferred embodiments of the present invention include both an arrangement and method of reading consecutive core cells contained in a core memory using a cascode barrel read technique. Advantages of using cascode barrel reading include an increase in the speed of reading data from a desired set of consecutive core cells over conventional techniques and a decrease in the number of sense amplifiers (samplers) used in conventional burst mode techniques.

While the invention has been described with reference to specific embodiments, the description is illustrative of the invention and not to be construed as limiting the invention. Various modifications and applications may occur to those skilled in the art without departing from the true spirit and scope of the invention as defined in the appended claims.

I claim:

1. In a core memory of a memory device comprising a plurality of core cells electronically coupled with a plurality of cascodes, a method for reading memory data, comprising:
   accessing a set of consecutively addressed cells in said plurality of core cells via said plurality of cascodes;
   sensing an output of a subset of said plurality of cascodes;
   reading said output of said subset of said plurality of cascodes; and
   looking ahead in each of said cascodes such that, subsequent to said sensing of an output of said subset of said plurality of cascodes and reading of said output of said subset of said plurality of cascodes, data from a core cell of said set of core cells, having a higher address and communicatively coupled with the selected cascode is established as a valid output from said selected cascode prior to said corresponding sampler next sensing said output of said selected cascode.

2. A method for reading memory data as described in claim 1, wherein said core memory is implemented with a plurality of samplers, each of said samplers being electronically coupled with consecutively addressed pairs of said core cells.

3. A method for reading memory data as described in claim 1, further comprising selecting each of said pairs of said core cells such that at least three additional core cells are consecutively addressable between said pair of core cells, said additional core cells being coupled with cascodes other than those cascodes coupled with said pair of core cells.

4. A computer core memory comprising:
   a plurality of core cells; and
   a plurality of cascodes electronically coupled with said plurality of core cells,
   wherein said computer core memory is enabled to access a set of consecutively addressed cells in said plurality of core cells via said plurality of cascodes and to sense an output of a subset of said plurality of cascodes by looking ahead in each of said cascodes such that, subsequent to sensing said output of said subset of said plurality of cascodes and reading said output of said subset of said plurality of cascodes, data from a core cell in said plurality of core cells, having a higher address and communicatively coupled with the selected cascode, is established as a valid output from said selected cascode prior to a corresponding sampler next sensing said output of said selected cascode.

5. A computer core memory device as described in claim 4, further comprising a plurality of samplers, each of said samplers being electronically coupled with consecutively addressed pairs of said core cells.

6. A computer core memory device as described in claim 4, wherein said set of consecutively addressed cells comprise at least three core cells.

7. A computer core memory device as described in claim 4, wherein an input of each of said samplers is communicatively coupled with at least four of said cascodes.

8. A computer core memory device as described in claim 4, wherein a pair of core cells is enabled to be selected from said set of consecutively addressed cells in said plurality of core cells such that at least three additional core cells are consecutively addressable between said selected pair of core cells.

9. A computer core memory device as described in claim 8, wherein said additional core cells are coupled with cascodes other than those cascodes coupled with said pair of core cells.

10. A computer core memory device as described in claim 4, wherein an input of said corresponding sampler is communicatively coupled with exactly four of said cascodes and each pair of said core cells is selectable from said set of consecutively addressed core cells such that exactly three additional core cells are consecutively addressable between said pair of core cells.

* * * * *